United States Patent
Anderson et al.

(10) Patent No.: US 7,785,955 B2
(45) Date of Patent: Aug. 31, 2010

(54) CMOS STRUCTURE AND METHOD INCLUDING MULTIPLE CRYSTALLOGRAPHIC PLANES

(75) Inventors: Brent A. Anderson, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 12/348,160

(22) Filed: Jan. 2, 2009

(65) Prior Publication Data

US 2009/0111225 A1    Apr. 30, 2009

Related U.S. Application Data

(62) Division of application No. 11/276,274, filed on Feb. 22, 2006, now Pat. No. 7,473,946.

(51) Int. Cl.
- *H01L 21/8238* (2006.01)
- *H01L 21/8242* (2006.01)
- *H01L 21/336* (2006.01)
- *H01L 21/00* (2006.01)
- *H01L 21/84* (2006.01)

(52) U.S. Cl. ................ 438/212; 438/243; 438/268; 438/164

(58) Field of Classification Search ............ 438/212, 438/978, 243, 268, 343, 137, 138, 164, 192, 438/319, 168, 187

See application file for complete search history.

(56) References Cited

U.S. PATENT DOCUMENTS

| 5,072,276 | A | 12/1991 | Malhi et al. |
|---|---|---|---|
| 6,483,171 | B1 | 11/2002 | Forbes et al. |
| 6,509,621 | B2 * | 1/2003 | Nakao ................. 257/421 |
| 6,689,650 | B2 * | 2/2004 | Gambino et al. ......... 438/157 |
| 6,815,277 | B2 | 11/2004 | Fried et al. |
| 6,867,468 | B2 | 3/2005 | Sharma et al. |
| 6,911,383 | B2 | 6/2005 | Doris et al. |
| 6,919,251 | B2 | 7/2005 | Rotondaro et al. |
| 6,920,061 | B2 | 7/2005 | Bhavnagarwala et al. |
| 6,936,881 | B2 | 8/2005 | Yeo et al. |
| 6,956,774 | B2 * | 10/2005 | Lung et al. ......... 365/185.28 |
| 7,250,658 | B2 | 7/2007 | Doris et al. |
| 2001/0012672 | A1 | 8/2001 | Dennison et al. |
| 2004/0266076 | A1 | 12/2004 | Doris et al. |
| 2005/0017240 | A1 | 1/2005 | Fazan |
| 2005/0263831 | A1 | 12/2005 | Doris et al. |
| 2007/0241365 | A1 | 10/2007 | Iwamatsu |

FOREIGN PATENT DOCUMENTS

JP    63-080561    4/1988

* cited by examiner

*Primary Examiner*—Chuong A. Luu
(74) *Attorney, Agent, or Firm*—Scully, Scott, Murphy & Presser, P.C.; Richard M. Kotulak, Esq.

(57) ABSTRACT

A complementary metal oxide semiconductor (CMOS) structure includes a semiconductor substrate having first mesa having a first ratio of channel effective horizontal surface area to channel effective vertical surface area. The CMOS structure also includes a second mesa having a second ratio of the same surface areas that is greater than the first ratio. A first device having a first polarity uses the first mesa as a channel and benefits from the enhanced vertical crystallographic orientation. A second device having a second polarity different from the first polarity uses the second mesa as a channel and benefits from the enhanced horizontal crystallographic orientation.

10 Claims, 6 Drawing Sheets

CMOS STRUCTURE AND METHOD INCLUDING MULTIPLE CRYSTALLOGRAPHIC PLANES

RELATED APPLICATIONS

This application is a divisional application of U.S. Ser. No. 11/276,274, filed Feb. 22, 2006 now U.S. Pat. No. 7,473,946.

BACKGROUND

1. Field of the Invention

The invention relates generally to complementary metal oxide semiconductor (CMOS) structures. More particularly, the invention relates to CMOS structures with enhanced performance.

2. Description of the Related Art

Complementary metal oxide semiconductor structures typically include a mated pair comprising one each of a p-channel and an n-channel field effect transistor. Due to the complementary doping of such a field effect transistor pair, CMOS devices generally provide low energy consumption semiconductor circuits. In turn, low energy consumption semiconductor circuits are particularly desirable within the context of microprocessors, other logic applications and portable electronics applications.

Similarly with other semiconductor devices, a trend also exists within CMOS device fabrication to enhance field effect transistor performance. In that regard, one variable of field effect transistor fabrication that is known to influence field effect transistor performance is a crystallographic orientation of a semiconductor substrate upon which a field effect transistor is fabricated. The different charge carrier modes within field effect transistors provide that p-FETs and n-FETs are advantageously fabricated upon different semiconductor substrate channel crystallographic orientations in order to provide individually optimized performance of p-FETs and n-FETs. For enhanced CMOS performance, it is thus desirable to provide a semiconductor substrate that accommodates multiple crystallographic orientations.

Examples of semiconductor structures that include multiple transistors having different performance characteristics incident to use of differing crystallographic orientation channel regions are known in the art. For example, Doris et al., in U.S. Pat. No. 6,911,383 teaches a semiconductor structure that comprises both a planar field effect transistor and a finFET located upon a semiconductor-on-insulator semiconductor substrate. The planar FET and the finFET may be fabricated using different crystallographic orientations for the planar field effect transistor channel and a semiconductor fin that comprises the finFET channel.

Due to ease of fabrication and low energy consumption, CMOS devices are likely to continue to be prevalent within the semiconductor fabrication art. Similarly, due to significant performance advantages, the fabrication of complementary p-FET and n-FET CMOS transistors with different semiconductor substrate channel crystallographic orientations is also a desirable goal within the semiconductor fabrication art. In light of the foregoing factors, a resulting goal is a desire to fabricate CMOS devices upon a single semiconductor substrate while accessing intrinsic mobility advantages of CMOS devices fabricated upon different semiconductor substrate channel crystallographic orientations.

SUMMARY OF THE INVENTION

The invention provides semiconductor structures and a method for fabricating a semiconductor structure. The semiconductor structures and the method use a pair of mesas within a semiconductor substrate. The semiconductor structures and the method are predicated upon differing ratios of a channel effective horizontal surface area and a channel effective vertical surface area within each of the pair of mesas. Within the semiconductor structures and the method, different polarities (i.e., typically p and n) of a first device and a second device (i.e., typically transistors) located using the pair of mesas as a pair of channels are selected to benefit from differing relative ratios of channel effective horizontal surface area to channel effective vertical surface area within each of the mesas. More specifically, within the semiconductor structures and method, the first device benefits from a vertical crystallographic orientation in comparison with a horizontal crystallographic orientation of the first mesa and the second device benefits from a horizontal crystallographic orientation in comparison with a vertical crystallographic orientation of the second mesa.

Within the embodiments and the invention, a "channel effective horizontal surface area" is intended as a horizontal surface area of a mesa intended to serve as a channel within a device, such as a CMOS device. Such a horizontal surface area: (1) will not have a channel stop dielectric layer located thereupon or thereover, but rather will typically have a gate dielectric layer located thereupon; and (2) will have a gate electrode located thereover. Thus, the embodiments and the invention contemplate that not all horizontal surface area of a mesa is intended as a "channel effective horizontal surface area."

Within the embodiments and the invention, a "channel effective vertical surface area" is intended as a vertical surface area of a mesa intended to serve as a channel within a device, such as a CMOS device. Such a vertical surface area: (1) will not have a channel stop dielectric layer located thereupon or thereover, but rather will typically have a gate dielectric layer located thereupon; and (2) will have a gate electrode located thereover. Thus, the embodiments and invention contemplate than not all vertical surface of a mesa is intended as a "channel effective vertical surface area."

A first semiconductor structure in accordance with the invention comprises a semiconductor substrate including: (1) a first mesa having a first ratio of channel effective horizontal surface area to channel effective vertical surface area; and (2) a second mesa having a second ratio of channel effective horizontal surface area to channel effective vertical surface area greater than the first ratio. Within the first semiconductor structure, the first mesa and the second mesa are at least substantially co-planar. The first semiconductor structure also includes: (1) a first device of a first polarity located using the first mesa as a first channel; and (2) a second device of a second polarity different from the first polarity located using the second mesa as a second channel. Within the first semiconductor structure, the first device benefits from a vertical crystallographic orientation in comparison with a horizontal crystallographic orientation of the first mesa and the second device benefits from a horizontal crystallographic orientation in comparison with a vertical crystallographic orientation of the second mesa.

A second semiconductor structure in accordance with the invention comprises a semiconductor substrate including: (1) a first mesa having a first ratio of channel effective horizontal surface area to channel effective vertical surface area; and (2) a second mesa having a second ratio of channel effective horizontal surface area to channel effective vertical surface area greater than the first ratio. The second structure also includes: (1) a first device of a first polarity located using the first mesa as a first channel; and (2) a second device of a second polarity different from the first polarity located using the second mesa as a second channel. Within the second structure, the first device benefits from a vertical crystallographic orientation in comparison with a horizontal crystallographic orientation of the first mesa and the second device benefits from a horizontal crystallographic orientation in comparison with a vertical crystallographic orientation of the second mesa. Finally, within the second structure at least one of the first channel and the second channel is designed to be only partially depleted.

A method in accordance with the invention includes forming a first mesa and a second mesa within a semiconductor substrate. The method also includes forming a dielectric layer covering the sidewall surfaces of the first mesa and the second mesa. The method further includes etching back the dielectric layer to expose the sidewall surfaces of at least the first mesa, thus providing the first mesa with a lower ratio of channel effective horizontal surface area to channel effective vertical surface area than the second mesa. Finally, the method also includes forming a first device of a first polarity using the first mesa as a first channel and a second device of a second polarity using the second mesa as a second channel. Within the method, the first polarity is selected to benefit from a vertical crystallographic orientation in comparison with a horizontal crystallographic orientation of the first mesa and the second polarity is selected to benefit from a horizontal crystallographic orientation in comparison with a vertical crystallographic orientation of the second mesa.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

FIG. 1 to FIG. 5 show a series of schematic cross-sectional and plan-view diagrams illustrating four embodiments of the invention.

Figure 1:
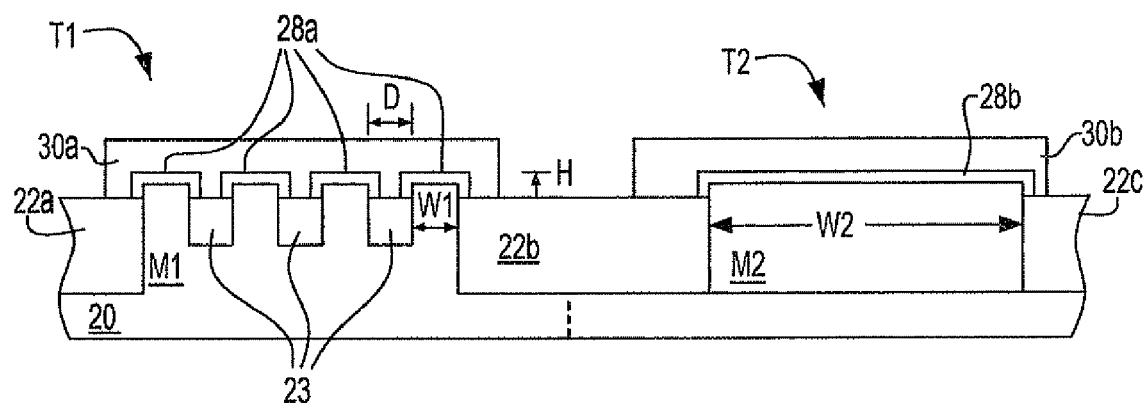
FIG. 1 to FIG. 5 show a series of schematic cross-sectional and plan-view diagrams illustrating a series of four CMOS structure embodiments of the invention.

FIG. 1 shows a schematic cross-sectional diagram of a first embodiment of the invention.

FIG. 1 shows a semiconductor substrate 20 having a first mesa M1 and a second mesa M2. The first mesa M1 comprises a plurality of sub-mesas each having a linewidth W1. The second mesa M2 comprises a single mesa having a linewidth W2. The first mesa M1 and the second mesa M2 are separated from each other (and from other mesas not illustrated) by a series of inter-mesa channel stop dielectric layers 22a, 22b and 22c. The series of sub-mesas within the first mesa M1 is separated from each other by a series of intra-mesa channel stop dielectric layers 23. A series of first gate dielectric layers 28a is located upon exposed horizontal and vertical portions of the sub-mesas within the first mesa M1, and a first gate electrode 30a is further located upon the series of first gate dielectric layers 28a and covering the series of the sub-mesas within the first mesa M1. A second gate dielectric layer 28b is located upon exposed horizontal and vertical portions of the second mesa M2, and a second gate electrode 30b is further located thereupon.

Within the first embodiment, the linewidth W1 of each of the sub-mesas within the first mesa M1 is typically from about 40 to about 200 nanometers and the linewidth W2 of the single second mesa is typically from about 100 to about 2000 nanometers. In addition, each of the sub-mesas within the first mesa M1 is separated from an adjacent sub-mesa within the first mesa M1 by a separation distance D from about 40 to about 200 nanometers. Finally, each of the sub-mesas within the first mesa M1, as well as the single mesa within the second mesa M2, has an exposed sidewall height H from about 40 to about 200 nanometers. The exposed sidewall height adjoins a pertinent inter-mesa channel stop dielectric layer 22a, 22b or 22c, or a pertinent intra-mesa channel stop dielectric layer 23.

Within the context of foregoing design limitations, the invention intends that at least one (and preferably each) of the first mesa M1 (including the sub-mesas) and the second mesa M2 when used as a channel within a field effect transistor or other field effect device is designed so that it is not fully depleted (i.e., is not fully influenced by an electric field generated by a gate electrode). As a comparison and distinction, vertical channel field effect transistor devices that use a semiconductor fin channel (i.e., finFET devices) are often designed to operate in a fully depleted mode (i.e., full influence of a gate electrode generated electric field within a semiconductor fin channel).

As is also illustrated in FIG. 1, the invention intends that upper surfaces of the first mesa M1 (including sub-mesas) and the second mesa M2 are co-planar or at least substantially co-planar (within manufacturing tolerances). Within the first embodiment as illustrated in FIG. 1, the series of inter-mesa channel stop dielectric layers 22a, 22b and 22c is intended as co-planar with the series of intra-mesa channel stop dielectric layers 23. Thus, the first mesa M1 (that comprises the series of sub-mesas) has a lower ratio of channel effective horizontal surface area to channel effective vertical surface area than the second mesa M2 (that comprises the single mesa).

Thus, in accordance description above, a first transistor T1 that uses the first mesa M1 as a channel is fabricated with a first polarity that benefits from the reduced ratio of channel effective horizontal surface area to channel effective vertical surface area. Similarly, a second transistor T2 that uses the second mesa M2 as a second channel is fabricated with a second polarity (i.e., different from and generally opposite the first polarity) that benefits from the enhanced ratio of channel effective horizontal surface area to channel effective vertical surface area.

Figure 2:
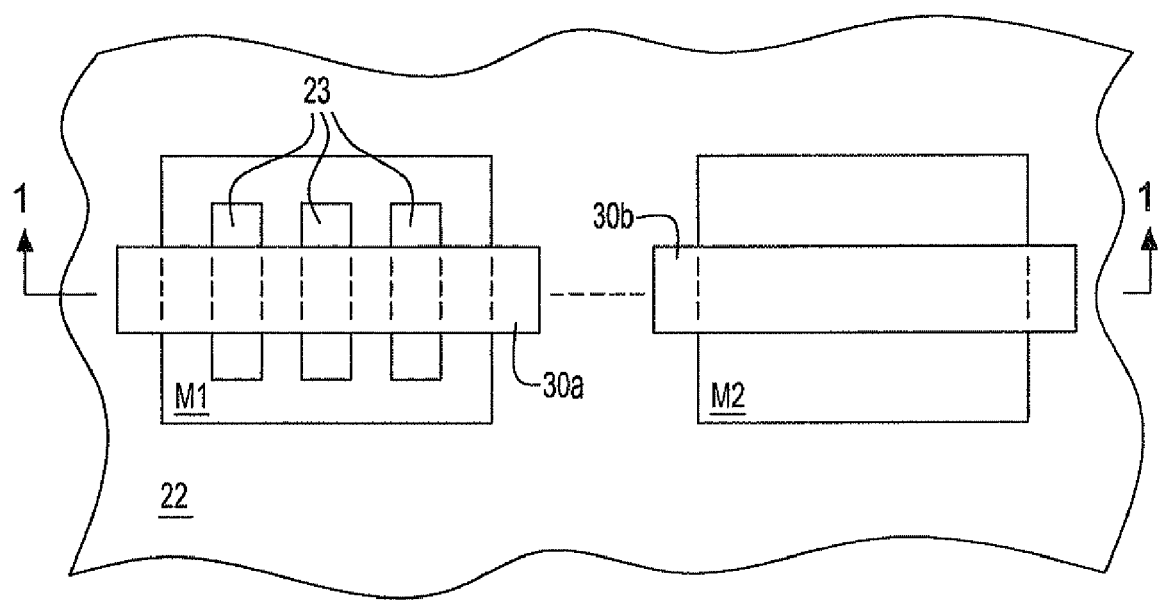

FIG. 2 shows a schematic plan view diagram corresponding with the schematic cross-sectional diagram of FIG. 1.

FIG. 2 shows the first mesa M1 and the second mesa M2 surrounded by the inter-mesa channel stop dielectric layer 22. The intra-mesa channel stop dielectric layers 23 are also illustrated within the first mesa M1. Similarly, FIG. 2 also illustrates the first gate electrode 30a traversing the first mesa M1 and the second gate electrode 30b traversing the second mesa M2. Remaining structures within the schematic cross-sectional diagram of FIG. 1 are omitted within the schematic plan-view diagram of FIG. 2, for clarity.

As is illustrated within FIG. 1 and FIG. 2, the sizings and locations of the first gate electrode 30a with respect to the first mesa M1 and the second gate electrode 30b with respect to the second mesa M2 are such that each of the first mesa M1 and the second mesa M2 has a single (and same) horizontal crystallographic orientation, and a single (and same) vertical crystallographic orientation. However, the invention is not necessarily so limited.

Finally, each of the first transistor T1 and the second transistor T2 is designed for channel current flow within a plane of either the first mesa M1 or the second mesa M2 (i.e., parallel to the top of the first mesa M1 or the second mesa M2). A channel current will flow within either the first mesa M1 or the second mesa M2 from one side of the gate electrode 30a or 30b to the other side of the gate electrode 30a or 30b, under the influence of a gate electrode 30a or 30b voltage.

Figure 3:
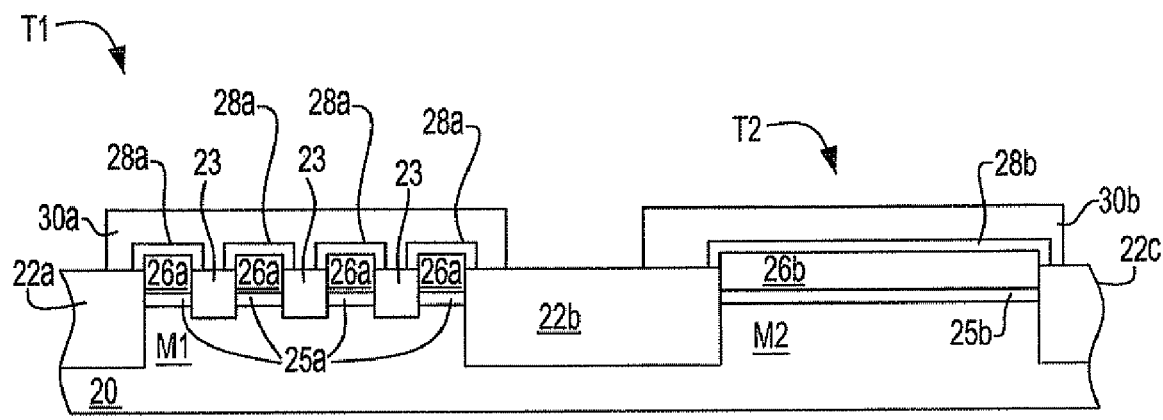

FIG. 3 shows a schematic cross-sectional diagram of a CMOS structure in accordance with a second embodiment of the invention.

The second embodiment correlates generally with the first embodiment insofar as a semiconductor substrate 20 still comprises a first mesa M1 and a second mesa M2. The first mesa M1 still further comprises a series of sub-mesas and the second mesa M2 still also comprises only a single mesa.

However, the second embodiment differs from the first embodiment by the presence of: (1) a series of embedded silicon-germanium alloy layers 25a that comprises an additional part of the series of sub-mesas within the first mesa M1; and (2) a second embedded silicon-germanium alloy layer 25b that comprises an additional part of the second mesa M2. The foregoing embedded silicon-germanium alloy layers may be used for etch enhancement purposes, or for other manufacturing or performance purposes. A series of first surface semiconductor layers 26a is located upon the series of first embedded silicon-germanium alloy layers 25a. The series of first surface semiconductor layers 26a also comprises an additional part of the series of sub-mesas within the first mesa M1. A second surface semiconductor layer 26b is located upon the second embedded silicon-germanium alloy layer 25b. The second surface semiconductor layer 26b also comprises a part of the second mesa M2. Within the second embodiment, the series of first gate dielectric layers 28a, the second gate dielectric layer 28b, the first gate electrode 30a and the second gate electrode 30b are otherwise analogous, equivalent or identical to the like referenced structures within the first embodiment that is illustrated in FIG. 1.

In comparison with the first embodiment, the second embodiment thus primarily provides a series of first embedded silicon-germanium alloy layers 25a sandwiched within a first mesa M1 and a single second embedded silicon-germanium alloy layer 25b sandwiched within a second mesa M2. The series of first embedded silicon-germanium alloy layers 25a and the second embedded silicon-germanium alloy layer 25b may be used to further advantageously influence CMOS device manufacturability or performance.

Figure 4:
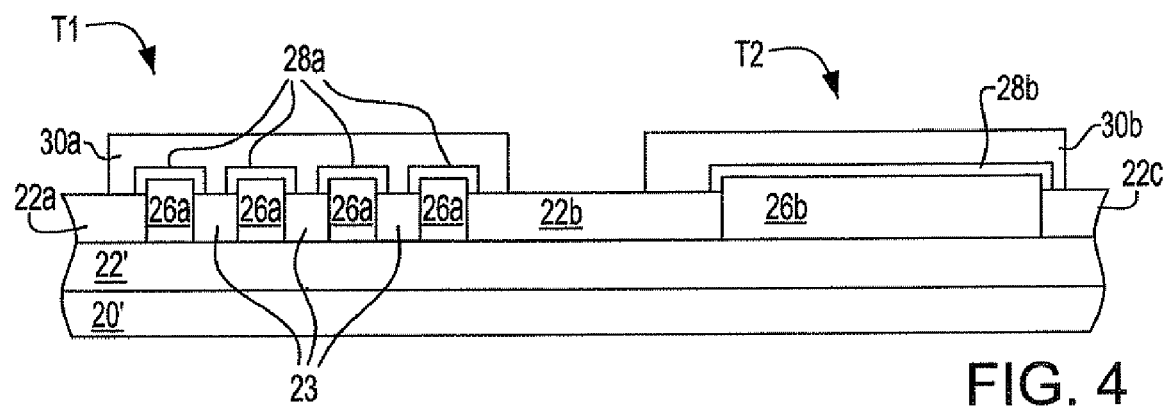

FIG. 4 shows a schematic cross-sectional diagram illustrating a CMOS structure in accordance with a third embodiment of the invention.

The third embodiment again generally correlates with the first embodiment and the second embodiment, with like or identical structures being referenced with identical reference numerals. However, the third embodiment uses a semiconductor-on-insulator substrate rather than the bulk semiconductor substrate 20 that is illustrated in FIG. 1 (for the first embodiment) and FIG. 3 (for the second embodiment). The semiconductor-on-insulator substrate comprises a semiconductor substrate 20'. The semiconductor-on-insulator substrate also comprises a buried dielectric layer 22' located upon the semiconductor substrate 20'.

Within the third embodiment, the series of first surface semiconductor layers 26a, and the second surface semiconductor layer 26b, are analogous, equivalent or identical to the series of first surface semiconductor layers 26a, and the second surface semiconductor layer 26b, within the second embodiment as illustrated in FIG. 3. The series of first gate dielectric layers 28a, the second gate dielectric layer 28b, the first gate electrode 30a and the second gate electrode 30b within the third embodiment are also analogous, equivalent or identical with the like referenced structures within the first embodiment as illustrated in FIG. 1, and the second embodiment as illustrated in FIG. 3.

Although not specifically illustrated in FIG. 4, each of the series of first surface semiconductor layers 26a is intended to be electrically interconnected to provide a first mesa. In addition, the second surface semiconductor layer 26b is intended as a second mesa. Although of different height dimensions in comparison with the first embodiment and the second embodiment, a series of inter-mesa channel stop dielectric layers 22a, 22b and 22c, and a series of intra-mesa channel stop dielectric layers 23 also exists within the third embodiment as illustrated in FIG. 3.

In accordance with FIG. 4, and as noted above, the third embodiment differs from the first embodiment and the second embodiment primarily through use of the semiconductor-on-insulator substrate in comparison with a bulk semiconductor substrate.

Figure 5:
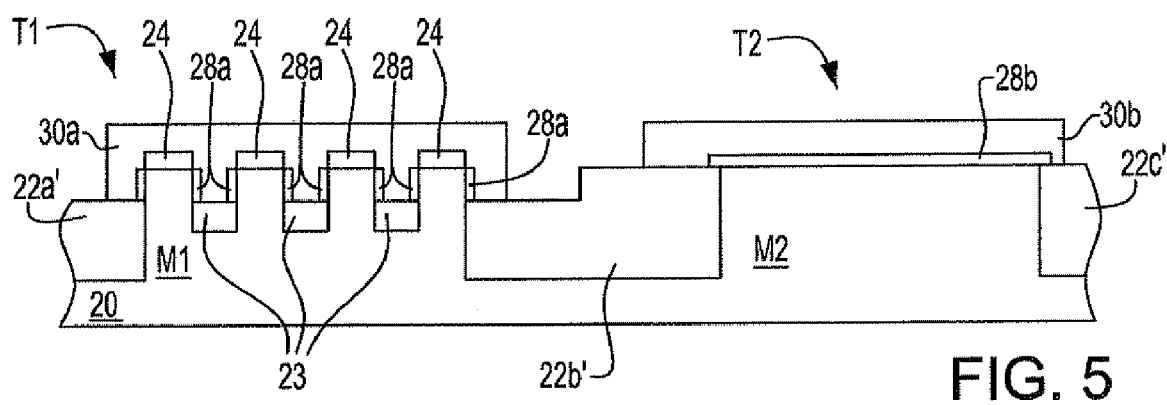

FIG. 5 shows a schematic cross-sectional diagram illustrating a CMOS structure in accordance with a fourth embodiment of the invention.

The fourth embodiment also correlates with the first embodiment and the second embodiment insofar as the fourth embodiment also uses a bulk semiconductor substrate 20 in comparison with the semiconductor-on-insulator substrate that is illustrated in FIG. 4 and used in the third embodiment. However, the fourth embodiment provides for a series of inter-mesa channel stop dielectric layers 22a', 22b' and 22c' whose top surfaces are not co-planar, as are the top surfaces of the inter-mesa channel stop dielectric layers 22a, 22b and 22c that are illustrated in FIG. 1, FIG. 3 and FIG. 4 for the first embodiment, second embodiment and third embodiment.

Rather, the inter-mesa channel stop dielectric layer 22a' and a portion of the inter-mesa channel stop dielectric layer 22b' comprise a lower planar level in the CMOS structure of FIG. 5. In addition, an adjoining portion of the inter-mesa channel stop dielectric layer 22b' and the inter-mesa channel stop dielectric layer 22c' comprise an upper planar level in the CMOS structure of FIG. 5.

Resulting from the differing heights of the inter-mesa channel stop dielectric layers 22a', 22b' and 22c' within the fourth embodiment is an extension of channel effective vertical surface area within the sub-mesas within the first mesa M1. The differing heights also yield an extinction of channel effective vertical surface area within the second mesa M2.

The fourth embodiment also illustrates a series of horizontal channel stop dielectric layers 24 located aligned upon the horizontal surfaces of the sub-mesas within the first mesa M1. The series of horizontal channel stop dielectric layers 24 serve (in conjunction with the series of intra-mesa channel stop dielectric layers 23) to extinguish a channel effective horizontal surface area within the first mesa M1.

Resulting from both: (1) the differing heights of the series of inter-mesa channel stop dielectric layers 22a', 22b' and 22c'; and (2) the presence of the series of horizontal channel stop dielectric layers 24, the fourth embodiment as illustrated in FIG. 5 is intended to illustrate a performance optimized CMOS structure. Within the performance optimized CMOS structure: (1) the first mesa M1 provides essentially only a channel effective vertical surface area and no channel effective horizontal surface area; and (2) the second mesa M2 provides essentially only a channel effective horizontal surface area and no channel effective vertical surface area.

In comparison with the foregoing three embodiments of the invention, the series of first gate dielectric layers 28a, the second gate dielectric layer 28b, the first gate electrode 30a and the second gate electrode 30b may comprise materials and be formed using methods analogous, equivalent or identical to the like referenced structures within the foregoing three embodiments. However, in comparison with the three foregoing embodiments, the series of first gate dielectric layers 28a, the second gate dielectric layer 28b, the first gate electrode 30a and the second gate electrode 30b, will as illustrated in FIG. 5 have different dimensions and shapes.

FIG. 1 to FIG. 5 show a series of schematic cross-sectional and plan-view diagrams illustrating a series of CMOS structures in accordance with four preferred embodiments of the invention. Each of the preferred embodiments uses a semiconductor substrate having a first mesa M1 and a second mesa M2. The first mesa M1 has a ratio of channel effective horizontal surface area to channel effective vertical surface area less than the second mesa M2. A first polarity of a first device located using the first mesa M1 as a channel is selected to benefit from the lower ratio of channel effective horizontal surface area to channel effective vertical surface area (i.e., enhanced vertical crystallographic orientation in comparison with horizontal crystallographic orientation). A second different polarity of a second device located using the second mesa M2 as a channel is selected to benefit from the higher ratio of channel effective horizontal surface area to channel effective vertical surface area (i.e., enhanced horizontal crystallographic orientation in comparison with vertical crystallographic orientation).

FIG. 6 to FIG. 10 show a series of schematic cross-sectional diagrams illustrating the results of progressive stages in fabricating a CMOS structure that correlates generally with the third embodiment as illustrated in FIG. 4.

Figure 6:
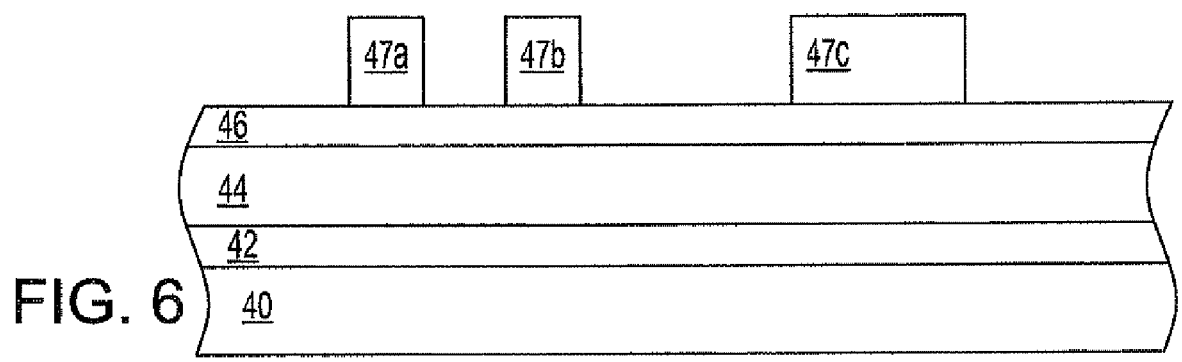
FIG. 6 to FIG. 10 show a series of schematic cross-sectional diagrams illustrating the results of progressive stages in fabricating a CMOS structure in accordance with the third embodiment of the invention.

FIG. 6 shows a semiconductor substrate 40. A buried dielectric layer 42 is located upon the semiconductor substrate 40. A blanket surface semiconductor layer 44 is located upon the buried dielectric layer 42. A blanket capping layer 46 is located upon the blanket surface semiconductor layer 44. A series of patterned photoresist layers 47a, 47b and 47c is located upon the blanket capping layer 46.

Each of the foregoing semiconductor substrate 40, blanket layers 42, 44 and 46 and patterned photoresist layers 47a, 47b and 47c may comprise materials and have dimensions that are conventional in the semiconductor fabrication art. Each of the foregoing semiconductor substrate 40, blanket layers 42, 44 and 46 and patterned photoresist layers 47a, 47b and 47c may be formed using methods that are conventional in the semiconductor fabrication art.

The semiconductor substrate 40 may comprise semiconductor materials including but not limited to silicon, germanium, silicon-germanium alloy, silicon carbide, silicon-germanium carbide alloy and compound (i.e., II-VI and III-V) semiconductor materials. Non-limiting examples of compound semiconductor materials include gallium arsenide, indium arsenide and indium phosphide semiconductor materials. Typically, the semiconductor substrate 40 comprises a silicon or silicon-germanium alloy (i.e., from about 10 to about 40 atomic percent germanium) semiconductor material having a thickness from about 1 to about 3 mils.

The blanket buried dielectric layer 42 may comprise dielectric materials that are also conventional in the semiconductor fabrication art. The blanket buried dielectric layer 42 may comprise any of several dielectric materials. Oxides, nitrides and oxynitrides of silicon are common. Oxides, nitrides and oxynitrides of other elements are not excluded. Typically, the blanket buried dielectric layer 42 has a thickness from about 50 to about 500 nanometers.

The semiconductor material which comprises the blanket surface semiconductor layer 44 need not necessarily have a doping type or a dopant concentration analogous, equivalent or identical to the doping type and dopant concentration of the semiconductor substrate 40. However, the blanket surface semiconductor layer 44 typically comprises a semiconductor material analogous, equivalent or identical to the semiconductor material from which the semiconductor substrate 40 is comprised. Typically, the blanket surface semiconductor layer 44 has a thickness of from about 50 to about 100 nanometers.

The blanket capping layer 46 may comprise any of several capping materials, although dielectric capping materials are most common. Dielectric capping materials typically include, but are not limited to oxides, nitrides and oxynitrides of silicon. However, oxides, nitrides and oxynitrides of other elements are not excluded. Dielectric capping materials may be formed using methods including but not limited to thermal oxidation or nitridation methods, plasma oxidation or nitridation methods, chemical vapor deposition methods and physical vapor deposition methods. Typically, the blanket capping layer 46 comprises a nitride or oxynitride capping material having a thickness from about 50 to about 200 nanometers. The nitride or oxynitride capping material may be formed using any of several methods, although a chemical vapor deposition method is most common.

The series of patterned photoresist layers 47a, 47b and 47c may comprise photoresist materials including but not limited to positive photoresist materials, negative photoresist materials and hybrid photoresist materials. The series of patterned photoresist layers 47a, 47b and 47c may be formed using spin coating, photoexposure and photodevelopment methods that are conventional in the semiconductor fabrication art.

Figure 7:
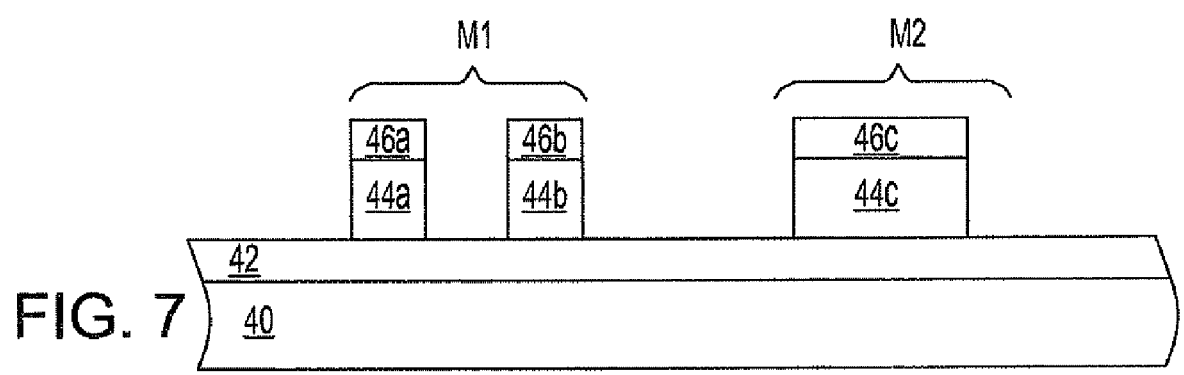

FIG. 7 shows the results of sequentially etching: (1) the blanket capping layer 46 to form a series of patterned capping layers 46a, 46b, and 46c; and (2) the blanket surface semiconductor layer 44 to form a series of patterned surface semiconductor layers 44a, 44b and 44c, while using (at least initially) the series of patterned photoresist layers 47a, 47b and 47c as an etch mask layer. The series of patterned photoresist layers 47a, 47b and 47c is also stripped from the series of patterned capping layers 46a, 46b and 46c to provide the semiconductor structure of FIG. 7.

The sequential etching of the foregoing blanket capping layer 46 and blanket surface semiconductor layer 44, to form the corresponding series of patterned capping layers 46a, 46b, and 46c, and patterned surface semiconductor layers 44a, 44b and 44c, may be effected using any of several methods. Anisotropic etching methods are generally preferred so that the foregoing series of patterned layers is provided with a series of straight sidewalls. Typically, anisotropic etch methods include plasma etch methods. The plasma etch methods typically use fluorine containing etchant gas compositions for etching silicon containing dielectric materials and chlorine containing etchant gas compositions for etching silicon and silicon-germanium alloy semiconductor materials.

As is illustrated in FIG. 7, a first pair of patterned capping layers 46a and 46b (optionally), and a first pair of patterned surface semiconductor layers 44a and 44b is intended to comprise a first mesa M1. In addition, a second patterned capping layer 46c (optionally) and a second patterned surface semiconductor layer 44c is intended to comprise a second mesa M2.

Figure 8:
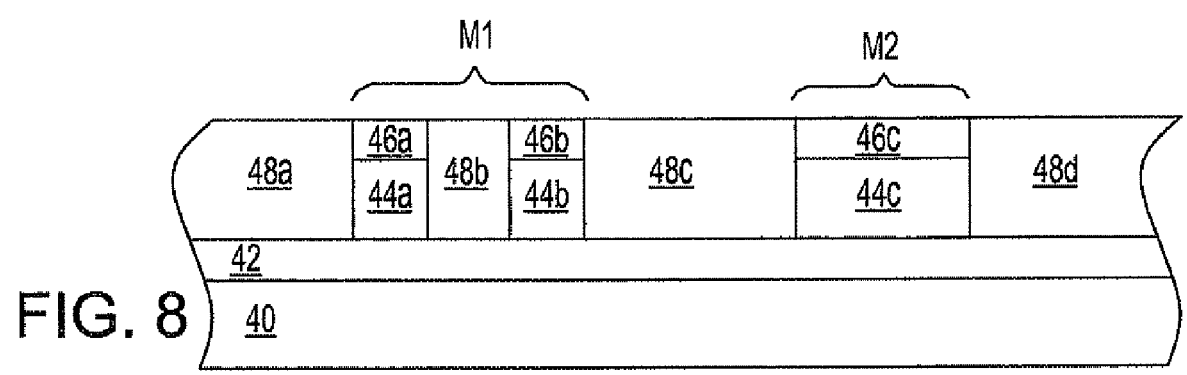

FIG. 8 shows a series of planarized inter/intra-mesa channel stop dielectric layers 48a, 48b, 48c and 48d located separating the first mesa M1 and the second mesa M2, as well as interposed between sub-mesas within the first mesa M1.

The planarized inter/intra-mesa channel stop dielectric layers 48a, 48b, 48c and 48d may comprise any of several dielectric materials. Oxide, nitride and oxynitride dielectric materials are common. The oxide, nitride or oxynitride dielectric materials typically also comprise silicon or silicon-germanium alloy content. Oxide, nitride or oxynitride dielectric materials of other elements, or other elemental combinations, are not precluded. Typically, each of the series of planarized inter/intra-mesa channel stop dielectric layers 48a, 48b, 48c and 48d comprises a silicon oxide dielectric material.

The series of planarized inter/intra-mesa channel stop dielectric layers 48a, 48b, 48c and 48d may be formed using any of several methods that are conventional in the semiconductor fabrication art. Non-limiting examples include thermal oxidation methods, thermal nitridation methods, chemical vapor deposition methods and physical vapor deposition methods.

Typically, the series of planarized inter/intra-mesa channel stop dielectric layers 48a, 48b, 48c and 48d results from deposition and subsequent planarization of a blanket inter/intra-mesa channel stop dielectric layer that is formed upon the semiconductor structure of FIG. 7 and subsequently planarized. Typically, the blanket inter/intra-mesa channel stop dielectric layer has a thickness from about 100 to about 300 nanometers. The blanket inter/intra-mesa channel stop dielectric layer may be planarized using methods that are conventional in the art. Typical methods include mechanical planarizing methods and chemical mechanical polish (CMP) planarizing methods. Chemical mechanical polish (CMP) planarizing methods are generally quite common. The series of patterned capping layers 46a, 46b and 46c is typically used as a series of planarizing stop layers.

Figure 9:
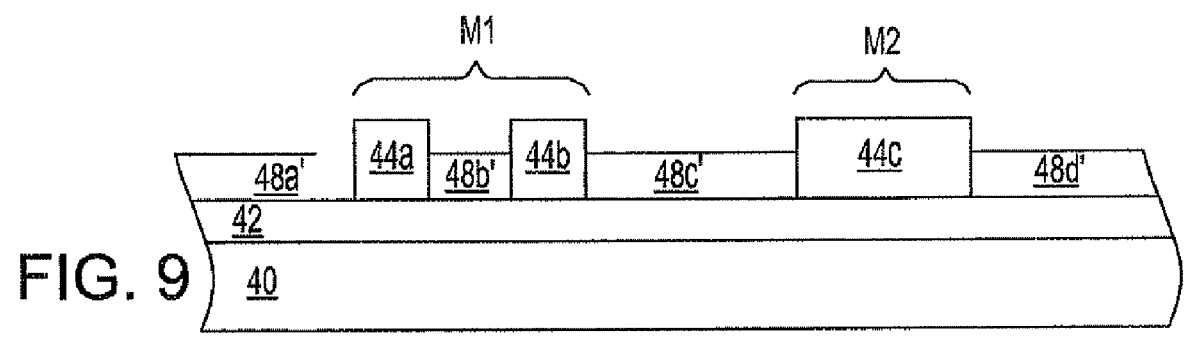

FIG. 9 first shows the results of etching back the series of planarized inter/intra-mesa channel stop dielectric layers 48a, 48b, 48c and 48d to form a series of etched back inter/intra-mesa channel stop dielectric layers 48a', 48b', 48c' and 48d'. The series of etched back inter/intra-mesa channel stop dielectric layers 48a', 48b', 48c' and 48d' exposes a series of sidewalls of the pair of patterned surface semiconductor layers 44a and 44b within the first mesa M1 and the patterned surface semiconductor layer 44c within the second mesa M2.

Etching back the series of planarized inter/intra-mesa channel stop dielectric layers 48a, 48b, 48c and 48d to form the series of etched back inter/intra-mesa channel stop dielectric layers 48a', 48b', 48c' and 48d' may be effected while using any of several etch methods that are conventional in the semiconductor fabrication art. Non-limiting examples include wet chemical etch methods, dry plasma etch methods and aggregate etch methods thereof. Typically, the series of planarized inter/intra-mesa channel stop dielectric layers 48a, 48b, 48c and 48d is etched back to form the series of etched back inter/intra-mesa channel stop dielectric layers 48a', 48b', 48c' and 48d' while using a reactive ion etch etchback method, although such is not a limitation of the instant embodiment or of the invention.

FIG. 9 also shows the results of stripping the series of patterned capping layers 46a, 46b and 46c from the corresponding series of patterned surface semiconductor layers 44a, 44b and 44c.

The series of patterned capping layers 46a, 46b and 46c may be stripped from the series of patterned surface semiconductor layers 44a, 44b and 44c while using methods and materials that are conventional in the semiconductor fabrication art. The methods may include, but are not limited to wet chemical stripping methods, dry plasma stripping methods and aggregate stripping methods thereof. When the series of patterned capping layers 46a, 46b, and 46c comprises a silicon nitride material or a silicon oxynitride material, the series of patterned capping layers 46a, 46b and 46c may be stripped using an aqueous phosphoric acid etchant solution at elevated temperature (i.e., from about 80 to about 100° C.).

Figure 10:
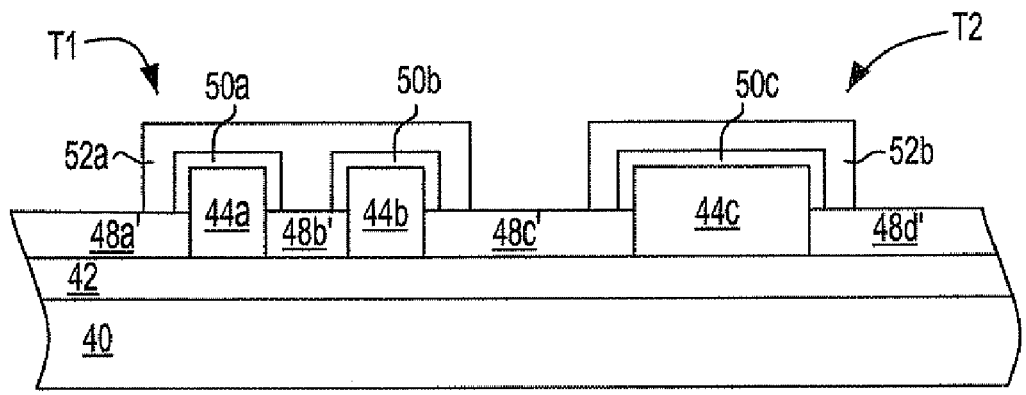

FIG. 10 shows a schematic cross-sectional diagram illustrating a final step in fabricating a CMOS semiconductor structure generally related to the third embodiment of the invention as illustrated in FIG. 4.

FIG. 10 first illustrates a series of gate dielectric layers 50a, 50b and 50c located upon exposed surfaces (i.e., vertical and horizontal) of the series of patterned surface semiconductor layers 44a, 44b and 44c. FIG. 10 also shows a pair of gate electrodes 52a and 52b located upon and covering the exposed surfaces (i.e., horizontal and vertical) of the series of gate dielectric layers 50a, 50b and 50c.

The series of gate dielectric layers 50a, 50b and 50c may comprise any of several gate dielectric materials. The gate dielectric materials may comprise generally lower dielectric constant dielectric materials, such as but not limited to oxides, nitrides and oxynitrides of silicon, typically having a dielectric constant from about 4 to about 10, measured in vacuum. The series of gate dielectric layers 50a, 50b and 50c may alternatively comprise generally higher dielectric constant dielectric materials having a dielectric constant from about 10 to at least about 30. These higher dielectric constant dielectric materials may include, but are not limited to, hafnium oxides, hafnium silicates, titanium oxides, barium strontium titantates (BSTs) and lead zirconate titanates (PZTs). The series of gate dielectric layers 50a, 50b and 50c may be formed using any of several methods. Thermal or plasma oxidation methods, thermal or plasma nitridation methods, chemical vapor deposition methods and physical vapor deposition methods are common, but do not limit the invention.

Typically, the series of gate dielectric layers 50a, 50b and 50c comprises a thermal silicon oxide material having a thickness from about 10 to about 70 angstroms.

The pair of gate electrodes 52a and 52b may comprise gate electrode materials that are conventional in the semiconductor fabrication art. Non-limiting examples include certain metals, metal alloys, metal nitrides, metal silicides, highly doped polysilicon (i.e., 1e18 to 1e22 dopant atoms per cubic centimeter) and polycide (highly doped polysilicon/metal silicide stack) conductor materials. The conductor materials may be formed using methods including but not limited to thermal or plasma silicidation or nitridation methods, chemical vapor deposition methods and physical vapor deposition methods. Preferably, each of the pair of gate electrodes 52a and 52b comprises a highly doped polysilicon material having a thickness from about 100 to about 300 nanometers from the top of a gate dielectric layer 50a, 50b or 50c, to the top of a gate electrode 52a or 52b.

FIG. 10 shows a schematic cross-sectional diagram of a CMOS semiconductor structure generally related to the CMOS structure of the third embodiment of the invention, as illustrated in FIG. 4.

The CMOS structure has a first mesa M1 (comprising a pair of patterned surface semiconductor layers 44a and 44b) that has a comparatively deficient ratio of channel effective horizontal surface area to channel effective vertical surface area. The CMOS structure also has a second mesa M2 (comprising a patterned surface semiconductor layer 44c) that has a comparatively enhanced ratio of channel effective horizontal surface area to channel effective vertical surface area.

A device fabricated using the first mesa M1 as a channel has a first polarity selected to benefit from the comparatively deficient ratio of channel effective horizontal surface area to channel effective vertical surface area (i.e., from an enhanced vertical crystallographic orientation in comparison with a horizontal crystallographic orientation). A device fabricated using the second mesa M2 as a channel has a different second polarity selected to benefit from the comparatively enhanced ratio of channel effective horizontal surface area to channel effective vertical surface area (i.e., from an enhanced horizontal crystallographic orientation in comparison with a vertical crystallographic orientation).

FIG. 11 to FIG. 14 show a series of schematic cross-sectional diagrams illustrating the results of progressive stages in fabricating a CMOS semiconductor structure also generally related to the third embodiment of the invention as illustrated in FIG. 4, but also incorporating features from the fourth embodiment of the invention as illustrated in FIG. 5.

The fabrication process sequence for the CMOS semiconductor structure in accordance with FIG. 11 to FIG. 14 also starts with the process steps of FIG. 6, FIG. 7 and FIG. 8.

Figure 11:
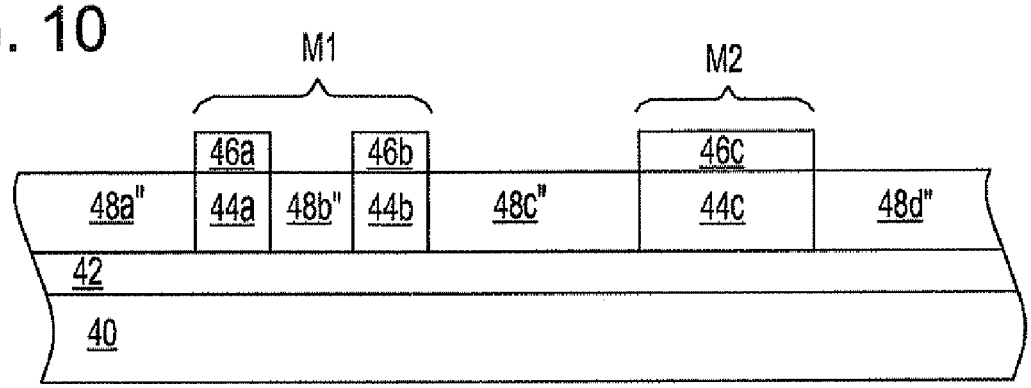
FIG. 11 to FIG. 14 show a series of schematic cross-sectional diagrams illustrating the results of progressive stages in fabricating a CMOS structure in accordance with the third embodiment of the invention, and further in accordance with the fourth embodiment of the invention.

Following from FIG. 8, FIG. 11 shows a schematic cross-sectional diagram of a semiconductor structure where: (1) the series of planarized inter/intra-mesa channel stop dielectric layers 48a, 48b, 48c and 48d is only etched back to the interfaces of the series of patterned capping layers 46a, 46b and 46c with the series of patterned surface semiconductor layers 44a, 44b and 44c to provide a series of etched back inter/intra mesa channel stop dielectric layers 48a", 48b", 48c" and 48d"; and (2) the series of patterned capping layers 46a, 46b and 46c is not stripped from the series of patterned surface semiconductor layers 44a, 44b and 44c.

The foregoing more limited etching back of the series of planarized inter/intra-mesa channel stop dielectric layers 48a, 48b, 48c and 48d to form the series of etched back inter/intra-mesa channel stop dielectric layers 48a", 48b", 48c" and 48d" may be effected using methods and materials that are disclosed above for etching back the series of planarized inter/intra-mesa channel stop dielectric layers 48a, 48b, 48c and 48d that is illustrated in FIG. 8 to form the series of etched back inter/intra-mesa channel stop dielectric layers 48a', 48b', 48c' and 48d' that is illustrated in FIG. 9.

Figure 12:
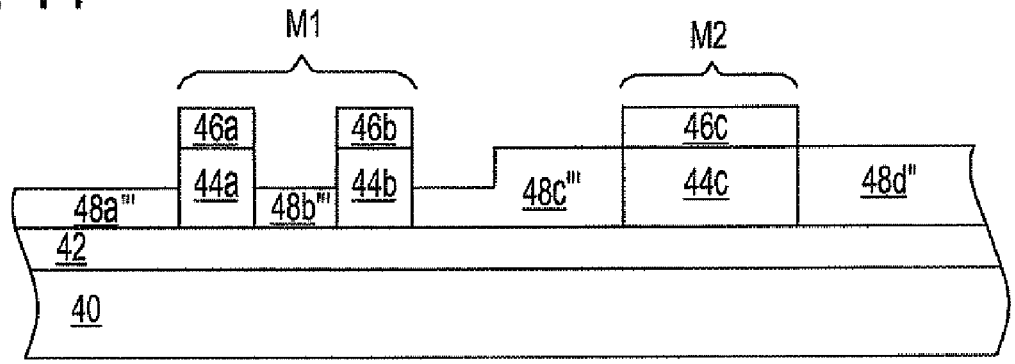

FIG. 12 shows a series of twice etched back inter/intra-mesa channel stop dielectric layers 48a''', 48b''' and 48c''' that results from further etching back of the series of etched back inter/intra-mesa channel stop dielectric layers 48a", 48b" and 48c" that is illustrated in FIG. 11. As is illustrated in FIG. 12, and in comparison with FIG. 1, only a portion of the etched back inter/intra-mesa channel stop dielectric layer 48c" is etched back to form the twice etched back inter/intra-mesa channel stop dielectric layer 48c'''. In addition, the etched back inter/intra-mesa channel stop dielectric layer 48d" is not further etched back at all. The result of the further etching back of the etched back inter/intra-mesa channel stop dielectric layers 48a", 48b" and 48c" to form the twice etched back inter/intra-mesa channel stop dielectric layers 48a''', 48b''' and 48c''' is that the sidewall portions of each of the patterned surface semiconductor layers 44a and 44b are considerably exposed in comparison with the sidewall portions of the patterned surface semiconductor layer 44c.

Figure 13:
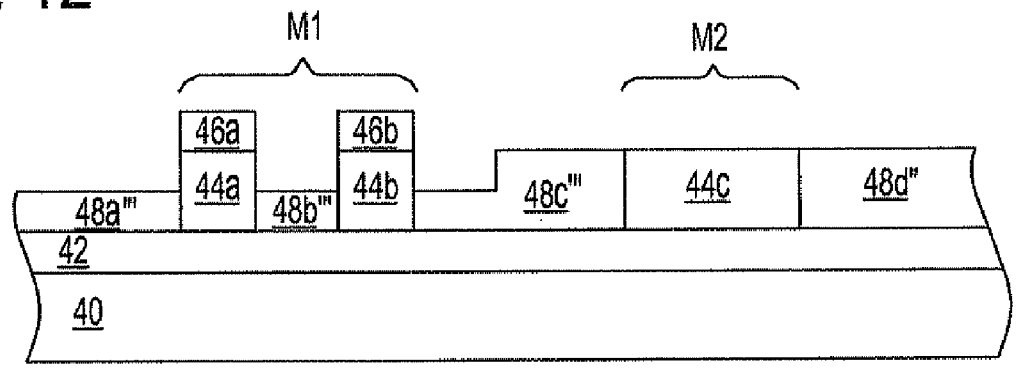

FIG. 13 shows the results of selectively stripping the patterned capping layer 46c from the patterned surface semiconductor layer 44c within the second mesa M2, while leaving the patterned capping layers 44a and 44b aligned upon the patterned surface semiconductor layers 44a and 44b within the first mesa M1.

The selective removal of the patterned capping layer 46c from the patterned surface semiconductor layer 44c within the second mesa M2, but not the corresponding patterned capping layers 46a and 46b from the patterned surface semiconductor layers 44a and 44b within the first mesa M1, may be effected using etch methods and materials that are disclosed above within the context of FIG. 9. A selective masking of the pair of patterned capping layers 46a and 46b is used in conjunction with the etch methods and materials.

Thus, as is illustrated within FIG. 13, the first mesa M1 has a substantial channel effective vertical surface area absent much channel effective horizontal surface area (due to presence of the pair of patterned capping layers 46a and 46b upon the corresponding pair of patterned surface semiconductor layers 44a and 44b), and the second mesa M2 has a substantial channel effective horizontal surface area absent much channel effective vertical surface area (due to complete or nearly complete sidewall coverage of the patterned surface semiconductor layer 44c).

Figure 14:
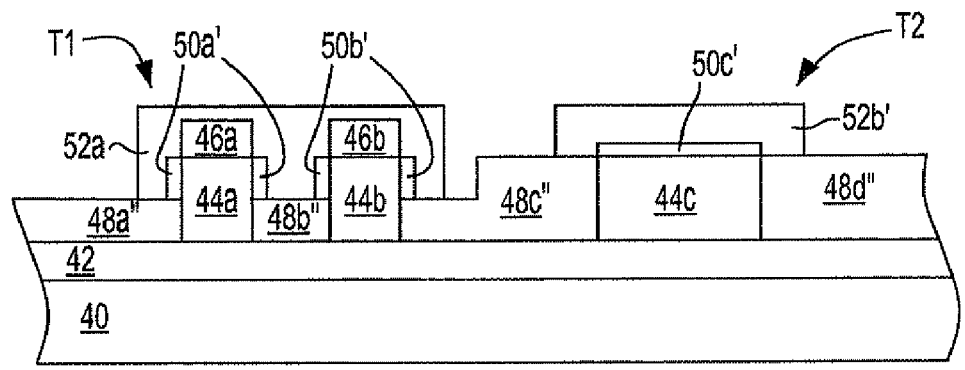

FIG. 14 shows: (1) a pair of gate dielectric layers 50a' located upon exposed sidewall portions of the patterned surface semiconductor layer 44a; (2) a pair of gate dielectric layers 50b' located upon exposed sidewall portions of the patterned surface semiconductor layer 44b; and (3) a gate dielectric layer 50c' located upon exposed horizontal portions of the patterned surface semiconductor layer 44c. Consistent with the existence of primarily vertical channel surface area within the patterned surface semiconductor layers 44a and 44b, and primarily horizontal channel surface area within the patterned surface semiconductor layer 44c, the two pair of gate dielectric layers 50a' and 50b' are primarily vertical and the single gate dielectric layer 50c' is primarily horizontal.

The series of gate dielectric layers 50a', 50b' and 50c' may comprise gate dielectric materials, have dimensions and be formed using methods analogous, equivalent or identical to the materials, dimensions and methods disclosed above in connection with the gate dielectric layers 50a, 50b and 50c illustrated in FIG. 10.

Finally, FIG. 14 also shows: (1) a gate electrode 52a' located upon and covering the pair of gate dielectric layers 50a' and 50b' within the first mesa M1; and (2) a gate electrode 52b' located upon and covering the gate dielectric layer 50c' within the second mesa M2.

The pair of gate electrodes 52a' and 52b' may comprise materials, and be formed using methods, analogous equivalent or identical to the materials and methods used for forming the pair of gate electrodes 50a and 50b that is also illustrated in FIG. 10. Due to the dimensional differences between: (1) (a) the etched back inter/intra-mesa channel stop dielectric layers 48a''', 48b''' and 48c'''; and (b) the etched back inter/intra-mesa channel stop dielectric layer 48d''; in comparison with (2) the etched back inter/intra-mesa channel stop dielectric layers 48a', 48b', 48c' and 48d', the general dimensions of the gate electrodes 52a' and 52b' will not be identical with the dimensions of the gate electrodes 52a and 52b that are illustrated in FIG. 10.

FIG. 14 shows a schematic cross-sectional diagram of a CMOS semiconductor structure generally related to the CMOS semiconductor structure of the third embodiment that is illustrated in FIG. 4, but also incorporating therein features of the CMOS semiconductor structure of the fourth embodiment that is illustrated in FIG. 5.

The CMOS structure of FIG. 14 shows a first mesa M1 comprising a pair of sub-mesas and a second mesa M2 comprising a single mesa. Each of a pair of patterned surface semiconductor layers 44a and 44b that also comprise the first mesa M1 has a predominant if not exclusive channel effective vertical surface area in comparison with a channel effective horizontal surface area. A patterned surface semiconductor layer 44c that comprises the second mesa M2 has a predominant if not exclusive channel effective horizontal surface area in comparison with a channel effective vertical surface area. A first polarity for a first device T1 that uses the first mesa M1 as a channel is selected to benefit from the predominant channel effective vertical surface area of the first mesa M1. A different second polarity for a second device T2 that uses the second mesa M2 as a channel is selected to benefit from the predominant channel effective horizontal surface area of the second mesa M2. The benefit of such crystallographic orientation selection for the first device T1 and the second device T2 is generally an enhanced charge carrier mobility.

Figure 15:
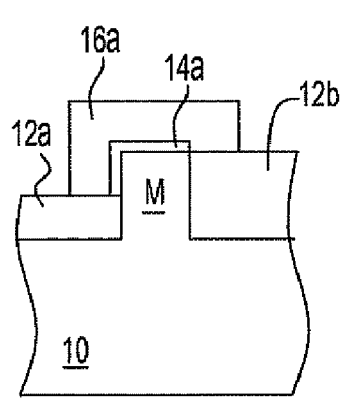
FIG. 15 to FIG. 17 show a series of schematic cross-sectional diagrams of partially covered mesas that provide a means for adjusting drive current within CMOS devices in accordance with the invention.
Figure 16:
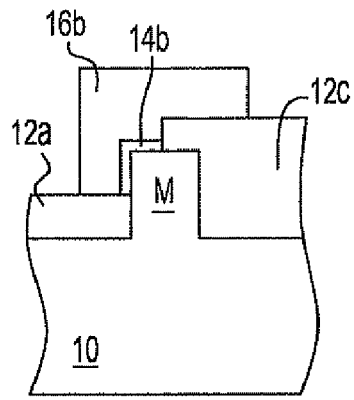
Figure 17:
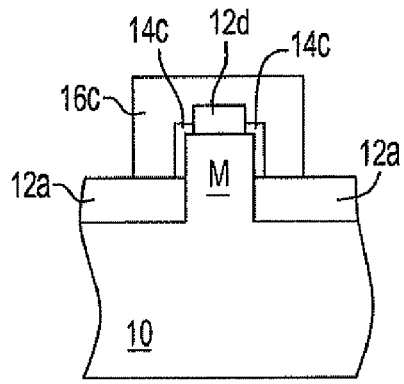

FIG. 15 to FIG. 17 show a series of schematic cross-sectional diagrams of partially covered mesas that may be used to provide a modified drive strength within a CMOS device. The following partially covered mesas may be formed using etch methods and other fabrication methods generally in accord with the foregoing preferred embodiments.

Each of FIG. 15, FIG. 16 and FIG. 17 shows a semiconductor substrate 10 having a mesa M located therein. Each of FIG. 15, FIG. 16 and FIG. 17 also shows a particular arrangement of at least two channel stop dielectric layers 12a and 12b, 12a and 12c, or 12a and 12d, located to cover certain horizontal surface and/or vertical surface portions of each of the mesas M. The certain horizontal and/or vertical surface portions of each of the mesas M covered by the foregoing combinations of the channel stop dielectric layers 12a, 12b, 12c and 12d comprise channel ineffective portions of the series of mesas M. Remaining portions of the mesas uncovered by the foregoing combinations of channel stop dielectric layers 12a, 12b, 12c and 12d comprise channel effective surface area portions (i.e., horizontal or vertical) of the series of mesas M. A series of gate dielectric layers 14a, 14b and 14c is located upon the channel effective portions of the mesas M not covered by the foregoing combinations of channel stop dielectric layers 12a, 12b, 12c and 12d. Finally, a corresponding series of gate electrodes 16a, 16b and 16c is located upon the series of gate dielectric layers 14a, 14b and 14c, thus covering both channel effective horizontal surface areas and channel effective vertical surface areas within each of the mesas M.

Also intended within the mesa structures of FIG. 15 to FIG. 17 is that the designated combinations selected from the series of channel stop dielectric layers 12a, 12b, 12c and 12d are sized and positioned to provide differing ratios of channel effective horizontal surface area to channel effective vertical surface area within each of the mesas M. For example, FIG. 15 is intended to show an enhanced ratio of channel effective horizontal surface area to channel effective vertical surface area since the top horizontal surface of the mesa M in FIG. 15 is not covered by a channel stop dielectric layer, but at least a portion of both of the sidewall vertical surfaces of the mesa M is covered by the channel stop dielectric layers 12a and 12b. FIG. 16 is intended to show an approximately neutral ratio of channel effective horizontal surface area to channel effective vertical surface area within mesa M since approximately equal portions of top horizontal surface and sidewall vertical surface of the mesa M are left uncovered by the channel stop dielectric layers 12a and 12c. Finally, FIG. 17 is intended to show a deficient ratio of channel effective horizontal surface area to channel effective vertical surface area since channel stop dielectric layer 12d covers most of the top horizontal surface of mesa M, but the pair of channel stop dielectric layers 12a do not cover most of the sidewall vertical surfaces of mesa M.

As disclosed above, a p or n polarity of each of the CMOS transistors in accordance with the invention is selected within the context a beneficial ratio of channel effective horizontal surface area to channel effective vertical surface area for a mesa M used as a channel for the CMOS transistor. For example, for a mesa having a 100 crystallographic orientation top (or other) horizontal surface and a 110 crystallographic orientation sidewall (or other) vertical surface: (1) a p-FET should use a mesa M with a deficient ratio of channel effective horizontal surface area to channel effective vertical surface area since a 110 crystallographic orientation favors a p-FET hole carrier mobility; and (2) an n-FET should use a mesa M with an enhanced ratio of channel effective horizontal surface area to channel effective vertical surface area since a 100 crystallographic orientation favors an n-FET electron carrier mobility.

Notwithstanding the above example, neither the invention nor any of the foregoing embodiments is intended to be limited to a semiconductor substrate having mesas of horizontal and vertical crystallographic orientations of 100 and 110 only. Rather, a person of skill in the art may readily discern workable semiconductor substrate mesa crystallographic orientations that may be used in accordance with the invention. Such workable crystallographic orientations may be discerned by evaluating appropriate field effect transistor based semiconductor substrate channel crystallographic orientation specific hole charge carrier mobility preferences and electron charge carrier mobility preferences.

Figure 18:
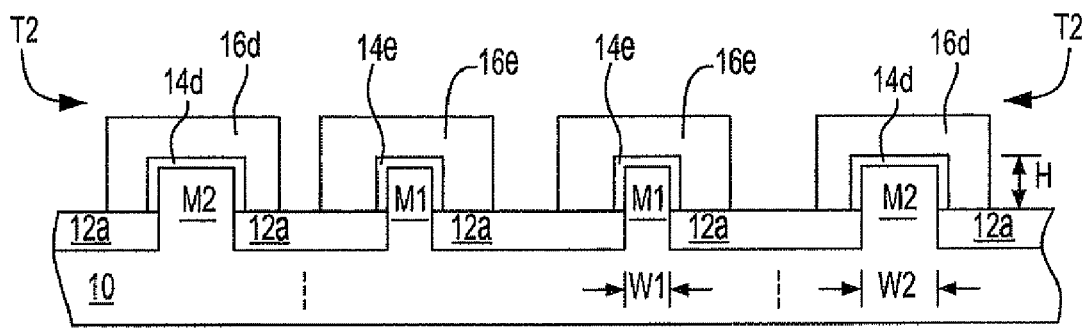
FIG. 18 shows a CMOS structure in accordance with the invention illustrated within the context of an SRAM implementation.

FIG. 18 shows an SRAM embodiment of the invention that may be used in conjunction with the preferred embodiments that are illustrated in FIG. 1 to FIG. 5. The preferred embodiments that are illustrated in FIG. 1 to FIG. 5 are typically logic circuitry embodiments.

The SRAM structure comprises a semiconductor substrate 10 that has a series of four mesas located therein. Two of the mesas are designated as M1 and the remaining two of the mesas are designated as M2. Each of the two mesas M1 has a linewidth W1 that is narrower than a linewidth W2 for each of the two mesas M2. The SRAM structure also comprises a series of identical channel stop dielectric layers 12a that preclude channel formation within identical lower portions of each of the two mesas M1 and the two mesas M2. A pair of gate dielectric layers 14d is located upon exposed portions of mesas M1, and a pair of gate electrodes 16d is further located thereupon. A pair of gate dielectric layers 14e is located upon exposed portions of the pair of mesas M2, and a pair of gate electrodes 16e is further located thereupon.

Due to a narrower mesa M1 linewidth W1 in comparison with mesa M2 linewidth W2, each of the mesas M1 has a reduced ratio of channel effective horizontal surface area to channel effective vertical surface area in comparison with each of mesas M2. Thus, within the context of the invention: (1) SRAM transistors T1 are fabricated with a first polarity that benefits from the reduced ratio of channel effective horizontal surface area to channel effective vertical surface area (i.e., benefit from enhanced vertical crystallographic orientation in comparison with horizontal crystallographic orientation).

and transistors T2 are fabricated with a second polarity different from the first polarity that benefits from an enhanced ratio of channel effective horizontal surface area to channel effective vertical surface area (i.e., benefits from enhanced horizontal crystallographic orientation in comparison with vertical crystallographic orientation).

Figure 19:
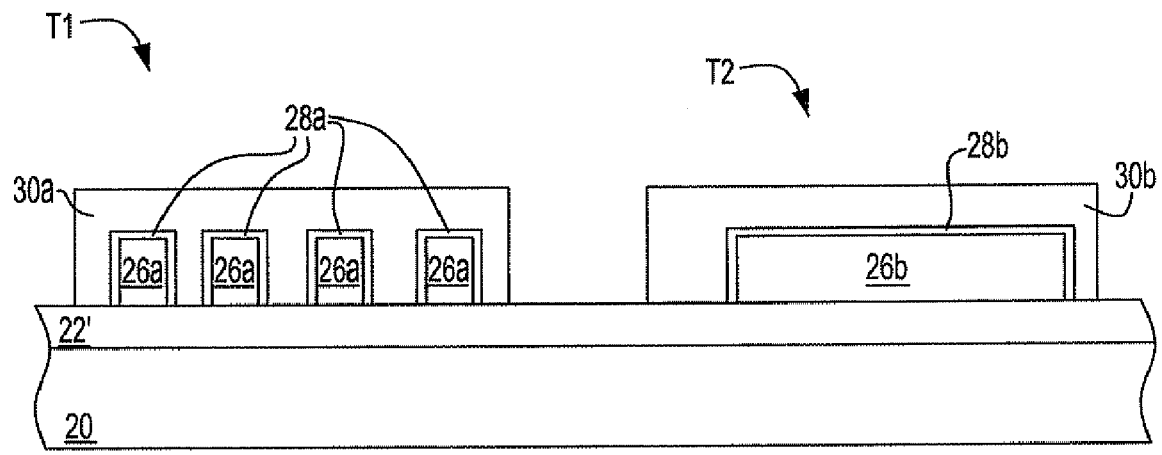
FIG. 19 and FIG. 20 show a pair of schematic cross-sectional diagrams illustrating a pair of CMOS structures in accordance with a pair of additional embodiments of the invention.
Figure 20:
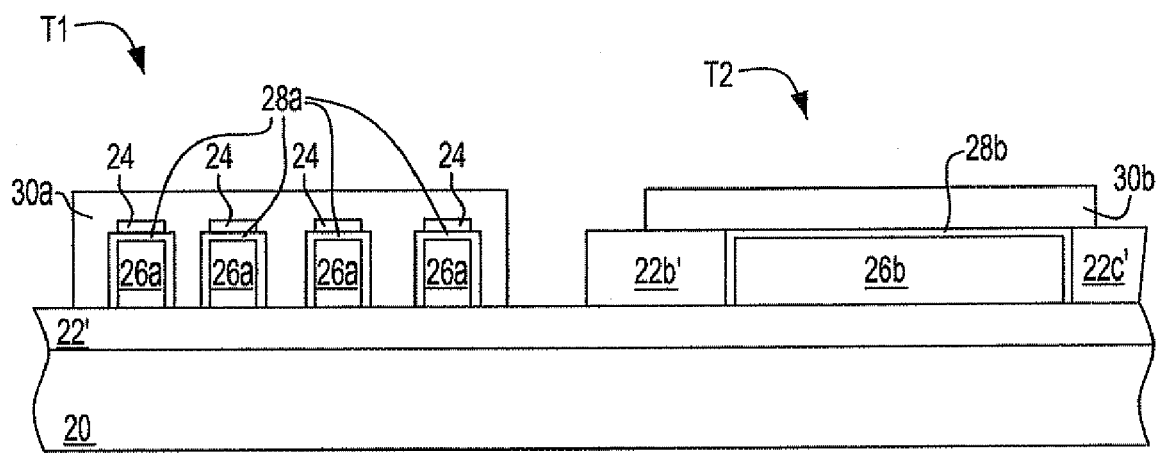

Finally, FIG. 19 and FIG. 20 show a pair of schematic cross-sectional diagrams illustrating an additional pair of CMOS structure embodiments of the invention. The pair derives from the CMOS structure of FIG. 4, which is based upon a semiconductor-on-insulator substrate. Like structures within FIG. 19 and FIG. 20 are numbered analogously or identically with FIG. 4. Both FIG. 19 and FIG. 20 illustrate a semiconductor substrate 20' having a buried dielectric layer 22' located thereupon. Patterned surface semiconductor layers 26a, gate dielectric layers 28a and gate electrodes 30a comprise the first transistors T1. Patterned surface semiconductor layers 26b, gate dielectric layers 28b and gate electrodes 30b comprise the second transistors T2. The gate electrodes 30a and 30b fully cover sidewalls of the patterned surface semiconductor layers 26a and 26b in a cost optimized CMOS structure the is illustrated in FIG. 19. The performance oriented CMOS structure that is illustrated in FIG. 20 further comprises a series of horizontal channel stop dielectric layers 24 located upon the series of patterned surface semiconductor layers 26a and a pair of inter-mesa channel stop dielectric layers 22b' and 22c covering the sidewalls of the patterned surface semiconductor layer 26b.

The preferred embodiments of the invention are illustrative of the invention rather than limiting of the invention. Revisions and modifications may be made to methods, materials, structures and dimensions for a CMOS structure in accordance with the preferred embodiments of the invention, while still providing a CMOS structure in accordance with the invention, further in accordance with the accompanying claims.

What is claimed is:

1. A method for fabricating a semiconductor structure comprising:

forming a first mesa and a second mesa within a semiconductor substrate;

forming a dielectric layer covering the sidewall surfaces of the first mesa and the second mesa;

etching back the dielectric layer to expose the sidewall surfaces of at least the first mesa, thus providing the first mesa with a lower ratio of channel effective horizontal surface area to channel effective vertical surface area than the second mesa; and forming a first device of a first polarity using the first mesa as a first channel and a second device of a second polarity using the second mesa as a second channel, where the first polarity is selected to benefit from a vertical crystallographic orientation in comparison with a horizontal crystallographic orientation of the first mesa and the second polarity is selected to benefit from a horizontal crystallographic orientation in comparison with a vertical crystallographic orientation of the second mesa.

2. The method of claim 1 wherein the etching back utilizes a first mask layer formed aligned upon the first mesa and a second mask layer formed aligned upon the second mesa.

3. The method of claim 2 further comprising removing the second mask layer from the second mesa but not the first mask layer from the first mesa after etching back the dielectric layer and prior to forming the first device and the second device.

4. The method of claim 1 wherein the etching back utilizes a mask that covers the second mesa but not the first mesa.

5. The method of claim 1 wherein the etching back exposes more of a sidewall on one side of a mesa than on an opposite side of the same mesa.

6. The method of claim 1 wherein the step of forming the first device and the second device provides that each of the first device and the second device benefits from an enhanced charge carrier mobility.

7. The method of claim 1 wherein the step of forming the first mesa and the second mesa within the semiconductor substrate comprises forming the first mesa and the second mesa that are at least substantially coplanar within the semiconductor substrate.

8. The method of claim 1 wherein the step of forming the first mesa and the second mesa within the semiconductor substrate comprises forming the first mesa and the second mesa designed so that at least one of the first channel and the second channel is only partially depleted.

9. The method of claim 1 wherein the step of forming the first mesa and the second mesa within the semiconductor substrate comprises forming the first mesa and the second mesa within a bulk semiconductor substrate.

10. The method of claim 1 wherein the step of forming the first mesa and the second mesa within the semiconductor substrate comprises forming the first mesa and the second mesa within a semiconductor-on-insulator substrate.

* * * * *